(12) United States Patent
Tian

(10) Patent No.: US 11,329,493 B2
(45) Date of Patent: May 10, 2022

(54) METHOD AND SYSTEM FOR TESTING OUTPUT STATE OF ADAPTOR AND COMPUTER STORAGE MEDIUM

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 201 days.

(21) Appl. No.: 16/728,244

(22) Filed: Dec. 27, 2019

(65) Prior Publication Data

US 2020/0136410 A1  Apr. 30, 2020

Related U.S. Application Data

(63) Continuation of application No. PCT/CN2018/109205, filed on Sep. 30, 2018.

(51) Int. Cl.
*H02J 7/00* (2006.01)
*G01R 19/165* (2006.01)

(52) U.S. Cl.
CPC ...... *H02J 7/0047* (2013.01); *G01R 19/16528* (2013.01); *G01R 19/16542* (2013.01)

(58) Field of Classification Search
CPC ...... H02J 7/0047; H02J 7/007; H02J 7/00036; G01R 19/16542; G01R 19/16528; G01R 31/40; H01J 7/00

See application file for complete search history.

(56) References Cited

U.S. PATENT DOCUMENTS

| 2006/0164035 A1* | 7/2006 | Van Beek | H02M 3/00 320/107 |
| 2014/0167685 A1* | 6/2014 | Tang | H01M 10/425 320/107 |

(Continued)

FOREIGN PATENT DOCUMENTS

| CN | 101865958 | 10/2010 |
| CN | 205509552 | 8/2016 |

(Continued)

OTHER PUBLICATIONS

EPO, Extended Search Report for EP Application No. 18935592.8, dated Dec. 16, 2020.

(Continued)

*Primary Examiner* — Tung S Lau
(74) *Attorney, Agent, or Firm* — Hodgson Russ LLP

(57) ABSTRACT

Provided are a method for testing an output state of an adaptor, a system for testing an output state of an adaptor, and a computer storage medium. The method includes the following. After an adaptor is instructed to enable quick charging, a first instruction is received, where the first instruction is used for instructing determination of a state of output voltage. In response to the first instruction, a first output voltage is acquired and a voltage state is determined according to the first output voltage. After a charging current corresponding to the quick charging is received, a current change rate of the charging current is acquired, and a current state is determined according to the current change rate. A test result of the output state of the adaptor is obtained according to the voltage state and the current state.

19 Claims, 5 Drawing Sheets

(56) References Cited

U.S. PATENT DOCUMENTS

| | | | | |
|---|---|---|---|---|
| 2014/0266068 A1* | 9/2014 | O'Brien | ............ | B60L 58/21 |
| | | | | 320/139 |
| 2016/0049803 A1 | 2/2016 | Hsu et al. | | |
| 2018/0351381 A1* | 12/2018 | Shin | ............ | H02J 7/00047 |
| 2021/0223323 A1* | 7/2021 | Lih | ............ | G01R 31/3835 |

FOREIGN PATENT DOCUMENTS

| | | | | | |
|---|---|---|---|---|---|
| CN | 205509552 U | * | 8/2016 | ............ | H02J 7/00 |
| CN | 106170901 | | 11/2016 | | |
| CN | 106841708 | | 6/2017 | | |
| CN | 107134816 | | 9/2017 | | |
| CN | 207352137 | | 5/2018 | | |
| JP | H08182209 | | 7/1996 | | |
| JP | 2014117070 | | 6/2014 | | |
| JP | 2017522844 | | 8/2017 | | |
| WO | WO-0245756 A2 | * | 6/2002 | ............ | A61L 2/0082 |

OTHER PUBLICATIONS

WIPO, International Search Report and Written Opinion for PCT/CN2018/109205, dated Jun. 12, 2019.

IPIN, First Examination Report for IN Application No. 201917053726, dated May 31, 2021.

JPO, Notice of Reasons for Refusal for JP Application No. 2021-500824, dated Mar. 4, 2022.

* cited by examiner

METHOD AND SYSTEM FOR TESTING OUTPUT STATE OF ADAPTOR AND COMPUTER STORAGE MEDIUM

CROSS-REFERENCE TO RELATED APPLICATION

This application is a continuation of International Application No. PCT/CN2018/109205, filed on Sep. 30, 2018, the entire disclosure of which is incorporated herein by reference.

TECHNICAL FIELD

This disclosure relates to the technical field of charging of terminals, and more particularly to a method for testing an output state of an adaptor, a system for testing an output state of an adaptor, and a computer storage medium.

BACKGROUND

Based on quick charging technology, a battery of a terminal can be charged with an adaptor in a multi-stage constant-current manner. As such, quick charging can be performed while ensuring safety and reliability, which improves greatly charging speed of the terminal. During the quick charging, the adaptor performs a two-way communication with the terminal, and therefore an output state (that is, an output voltage and an output current) of the adaptor has some influence on flash charging.

In the related art, the output state of the adaptor is detected with an oscilloscope. In such detecting process, a large quantity of detecting instructions are required and the detecting process is complicated, which results in low detecting efficiency and poor detecting accuracy.

SUMMARY

A method for testing an output state of an adaptor is provided. The method includes the following. After an adaptor is instructed to enable quick charging, a first instruction is received from the adaptor, where the first instruction is used for instructing determination of a voltage state of the adaptor. In response to the first instruction, a first output voltage is acquired and a voltage state is determined according to the first output voltage. After a charging current corresponding to the quick charging is applied, a current change rate of the charging current is acquired, and a current state is determined according to the current change rate. A test result of the output state of the adaptor is obtained according to the voltage state and the current state.

A system for testing an output state of an adaptor is provided. The system includes at least one processor and a memory. The memory is configured to store program codes which, when executed by the processor, are operable with the testing system to: receive a first instruction from the adaptor after the testing system instructs the adaptor to enable quick charging, wherein the first instruction is used for instructing determination of an voltage state of the adaptor; acquire an output voltage in response to the first instruction; determine the voltage state according to the output voltage; receive a charging current corresponding to the quick charging from the adaptor; acquire a current change rate of the charging current; determine a current state according to the current change rate; obtain a test result of the output state of the adaptor according to the voltage state and the current state.

A non-transitory computer readable storage medium is provided. The non-transitory computer readable storage medium is configured to store programs which, when executed by a testing system for testing an output state of an adaptor, are operable with the testing system to: receive a first instruction from the adaptor after the testing system initiates quick charging communication with the adaptor, wherein the first instruction is used for instructing determination of a voltage state of the adaptor; acquire an output voltage of the adaptor in response to the first instruction; determine the voltage state according to the output voltage; receive a charging current corresponding to the quick charging from the adaptor; acquire a current change rate of the charging current; determine a current state according to the current change rate; obtain a test result of the output state of the adaptor according to the voltage state and the current state.

DETAILED DESCRIPTION

Technical solutions of implementations will be described clearly and completely in connection with the accompanying drawings. It can be understood that, implementations described herein are merely for explaining rather than limiting the present disclosure. In addition, for the convenience of description, only parts related to the implementations are illustrated in the accompanying drawings.

In quick charging of a terminal, a specialized adaptor and a specialized battery are needed to achieve flash charging. In general, an adaptor intended for flash charging is provided with a microcontroller unit (MCU) smart chip, and therefore the adaptor is a smart charger that can be updated.

Figure 1:
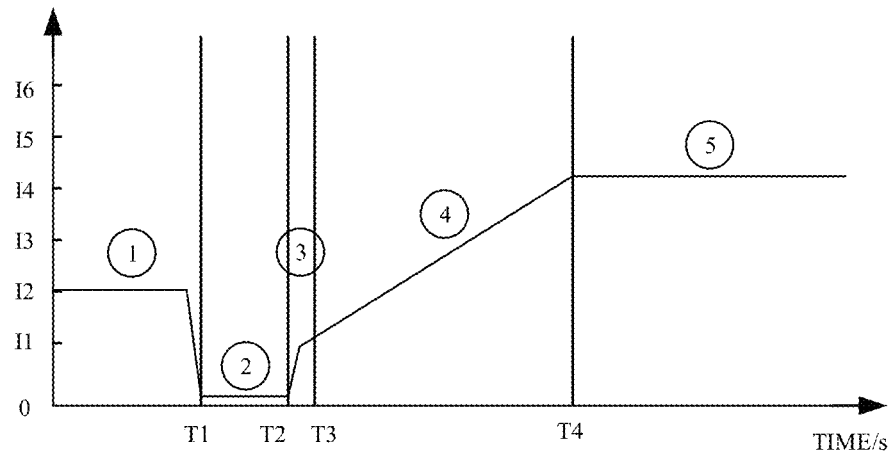
FIG. 1 is a schematic diagram illustrating a communication process for quick charging according to implementations.

FIG. 1 is a schematic diagram illustrating a communication process for quick charging according to implementations. As illustrated in FIG. 1, quick charging of the terminal by the adaptor mainly includes the following five stages.

Stage 1: the terminal detects the type of the adaptor. The adaptor initiates handshake communication between the adaptor and the terminal. The adaptor sends an instruction to the terminal to inquire whether to enable a quick charging mode. When the terminal agrees to enable the quick charging mode, the communication process for quick charging proceeds to stage 2.

The terminal can detect the type of the adaptor through D+ and D−. When the adaptor is detected to be a non-universal serial bus (USB) charging apparatus, a current received by the terminal can be larger than a preset current value I2. Upon detecting that an output current of the adaptor is larger than or equal to I2 within a preset duration, the adaptor can consider that the terminal has completed recognizing the type of the adaptor, and initiates the handshake communication between the adaptor and the terminal. The adaptor sends an instruction to the terminal to inquire whether to enable the quick charging mode. Upon receiving from the terminal a reply instruction indicating that the terminal disagrees to enable the quick charging mode, the adaptor detects again the output current of the adaptor. When the output current of the adaptor is still larger than or equal to I2, the adaptor initiates again a request to inquire whether the terminal agrees to enable the quick charging mode. The above steps of stage 1 are repeated until the terminal agrees to enable the quick charging mode or the output current of the adaptor is no longer larger than or equal to I2.

Stage 2: the adaptor sends to the terminal another instruction to inquire whether an output voltage of the adaptor is suitable. After the terminal replies to the adaptor that the output voltage of the adaptor is high, low, or suitable, the adaptor adjusts the output voltage until the output voltage is suitable.

The output voltage of the adaptor can have multiple grades. The adaptor can send to the terminal an instruction to inquire whether the output voltage of the adaptor matches a charging voltage for the quick charging mode. If the adaptor receives from the terminal feedback that the output voltage of the adaptor is high or low, the adaptor adjusts its output voltage by one grade and sends again the instruction to the terminal to inquire whether the output voltage is suitable.

Stage 3: the adaptor sends to the terminal another instruction to inquire a maximum charging current that the terminal can currently support. The terminal replies to the adaptor the maximum charging current, and the communication process proceeds to stage 4.

Stage 4: the adaptor sets the output current thereof to be the maximum charging current that the terminal can currently support, and the communication process proceeds to a constant-current stage, that is, stage 5.

Stage 5: in the constant-current stage, the adaptor sends, at a certain time interval, another instruction to inquire a present voltage of a battery of the terminal. The terminal feeds back the present voltage of the battery to the adaptor. The adaptor determines, according to the present voltage of the battery fed back by the terminal, whether the terminal is in a good contact and whether it is necessary to decrease a present charging current of the terminal.

It is to be noted that, the constant-current stage however does not mean that the output current of the adaptor remains unchanged in stage 5. The "constant-current" refers to multi-stage constant current, that is, the output current remains unchanged in a certain time period.

Since the quick charging is achieved by establishing a two-way communication between the adaptor and the terminal for multi-stage constant-current charging of the terminal, each parameter in instructions sent by the adaptor has a great influence on the flash charging. Therefore, it is of vital importance to detect the parameters in instructions sent by the adaptor.

Hereinafter, technical solutions of implementations will be described clearly and completely with reference to the accompanying drawings.

Figure 2A:
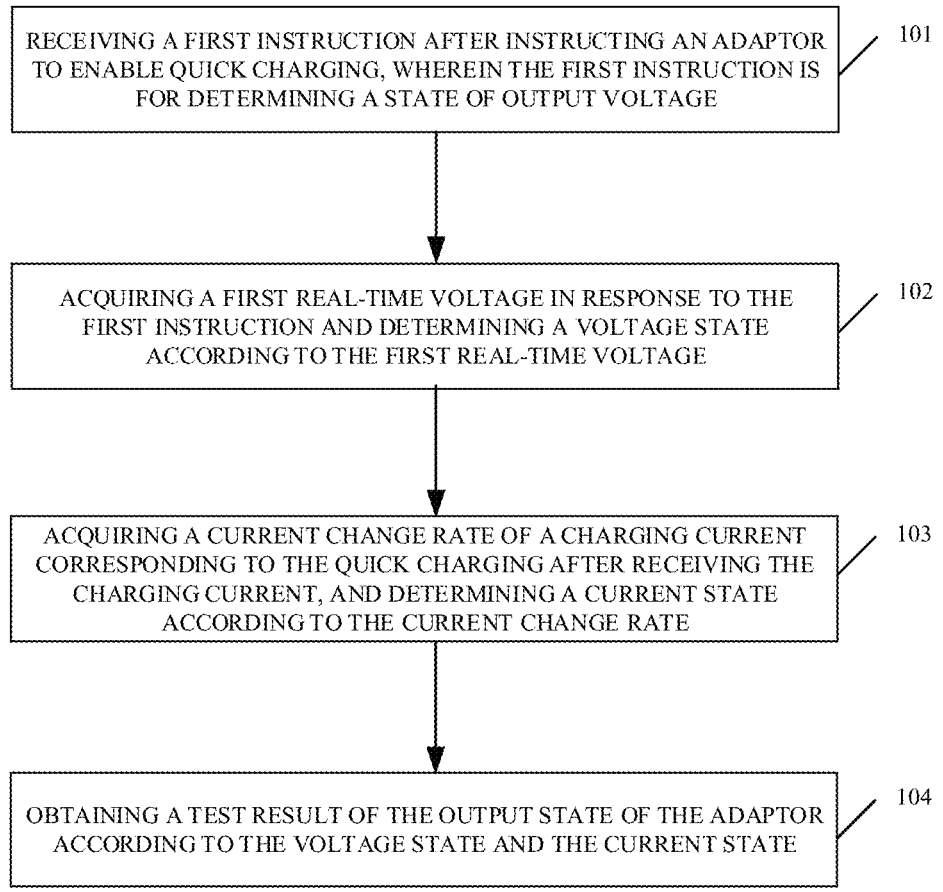
FIG. 2A is a schematic flowchart of a method for testing an output state according to implementations.

A method for testing an output state is provided. FIG. 2A is a schematic flowchart of a method for testing an output state according to implementations. As illustrated in FIG. 2A, a testing system performs the method as follows.

At block 101, after instructing an adaptor to enable quick charging, the testing system receives a first instruction, where the first instruction instructs the testing system to determine a state of output voltage.

According to implementations, the testing system receives the first instruction after instructing the adaptor to enable the quick charging.

It is to be noted that, according to implementations, the first instruction instructs the testing system to determine the state of output voltage.

In addition, based on FIG. 1, the testing system can receive the first instruction in stage 2 of communication with the adaptor for quick charging.

Figure 3:
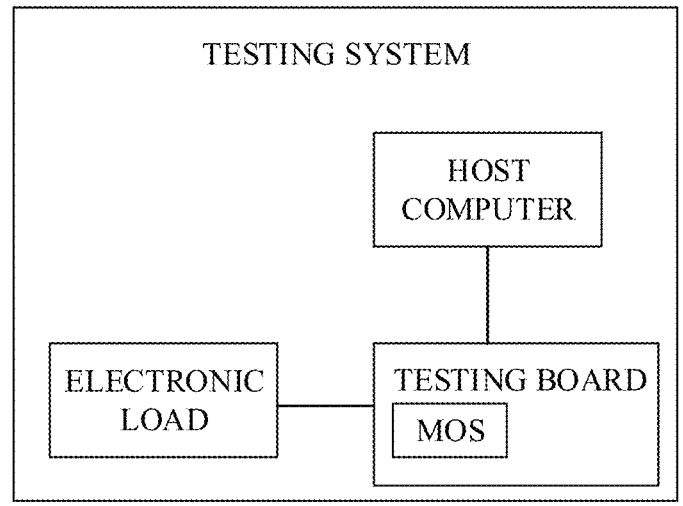
FIG. 3 is a schematic diagram of a testing system according to implementations.

It is to be noted that, according to implementations, the testing system can be a system for detecting parameters of the adaptor. FIG. 3 is a schematic diagram of a testing system according to implementations. As illustrated in FIG. 3, the testing system includes a testing board, an electronic load, and a host computer. The testing board is coupled with and cooperates with the electronic load and at the same time, simulates a state of the terminal by controlling a metal-oxide-semiconductor field-effect transistor (MOSFET) switch. Specifically, according to implementations, the testing board can transmit various values detected of the adaptor to the host computer, for example, the testing board reports the output state detected of the adaptor to the host computer.

Figure 4:
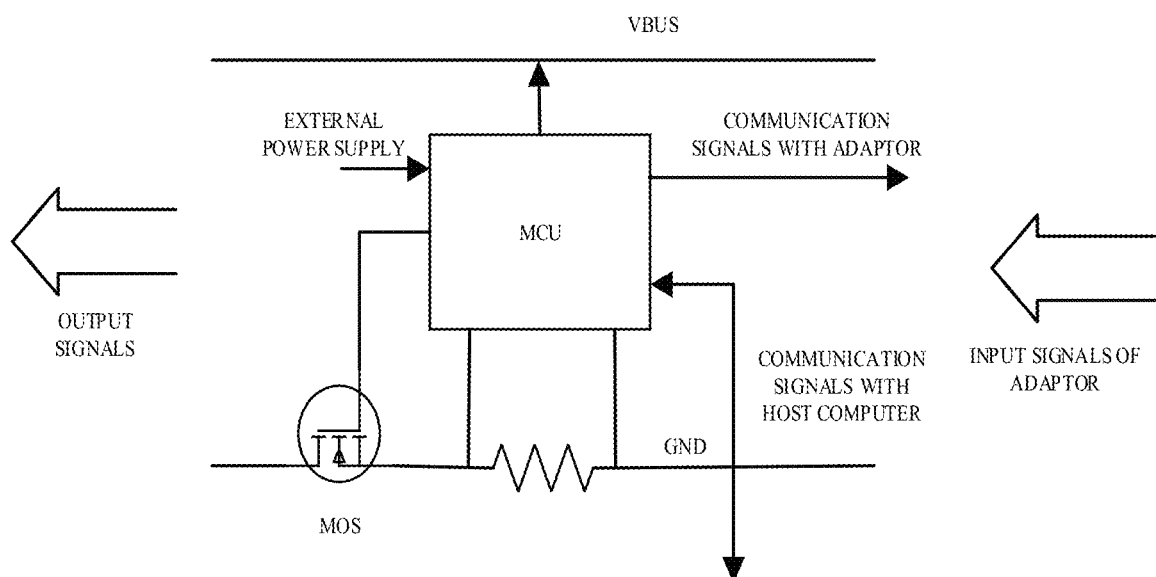
FIG. 4 is a schematic diagram of a testing board according to implementations.

It is to be noted that, based on FIG. 2, FIG. 4 is a schematic diagram of a testing board according to implementations. As illustrated in FIG. 4, the testing board is integrated with an MCU and a MOS. VBUS represents USB voltage, and GND represents power ground.

Figure 5:
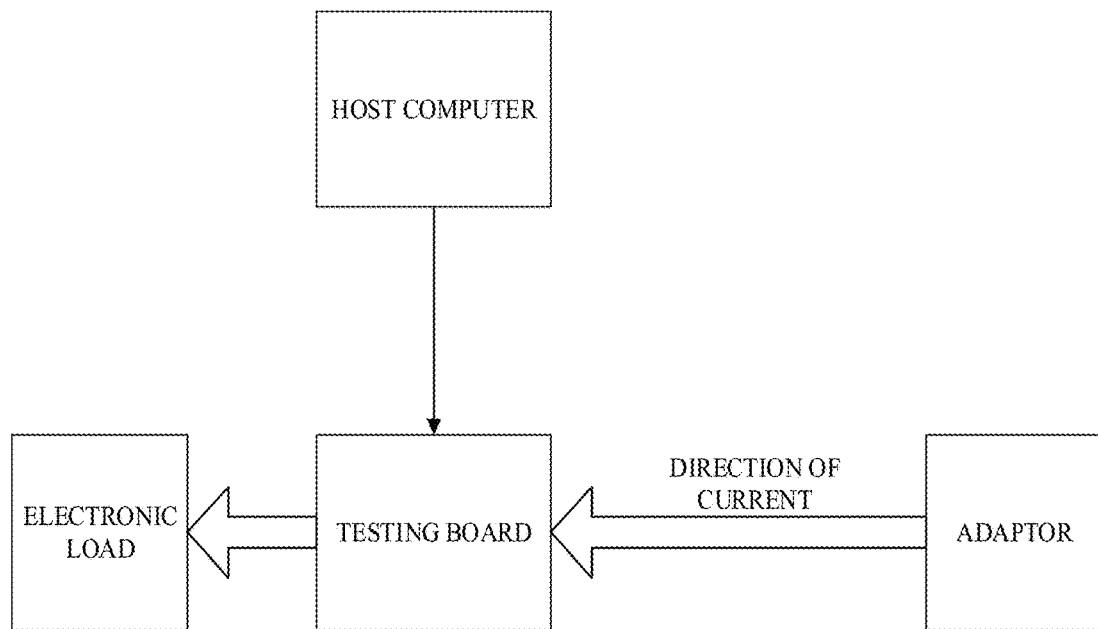
FIG. 5 is a schematic diagram illustrating connection between a testing system and an adaptor according to implementations.

In addition, based on FIG. 2, FIG. 5 is a schematic diagram illustrating connection between a testing system and an adaptor according to implementations. As illustrated in FIG. 5, the testing board of the testing system is configured to be coupled with the adaptor and to perform a two-way communication with the adaptor.

It is to be noted that, according to implementations, through coupling and communication with the adaptor, the testing system can simulate the quick charging of the terminal performed by the adaptor, such that each parameter of the adaptor can be directly tested without acquiring via an oscilloscope a test result of the parameters of the adaptor.

In addition, according to implementations, the adaptor is configured to perform the quick charging on the terminal. Specifically, the adaptor is configured to be coupled with the terminal through a USB interface. The USB interface may be a normal USB interface, a micro USB interface, a Type C interface, or the like. The USB interface has a power line configured for charging of the terminal by the adaptor. The power line of the USB interface may be a VBUS line and/or a ground line of the USB interface. The USB interface has a data line configured for two-way communication between the adaptor and terminal. The data line may be a D+ line and/or a D-line of the USB interface. The "two-way communication" can refer to information interaction between the adaptor and the terminal.

In addition, according to implementations, the adaptor is operable in a normal charging mode or a quick charging mode. A charging current in the quick charging mode is larger than that in the normal charging mode, that is, a charging speed in the quick charging mode is higher than that in the normal charging mode. In general, the normal charging mode can be comprehended as a charging mode in which a rated output voltage is 5V (volt) and a rated output current is smaller than or equal to 2.5 A (ampere). In addition, in the normal charging mode, output ports D+ and D− of the adaptor can be short-circuited. However, in the quick charging mode, the adaptor can communicate and exchange data with the terminal through D+ and D−.

It is to be noted that, according to implementations, since the adaptor is a decisive factor in the quick charging of the terminal, it is of great importance to test performance parameters of the adaptor. The performance parameters of the adaptor can include time parameters regarding sending instructions, an output voltage, an output current, etc. The output state of the adaptor according to implementations can include the output voltage and the output current, that is, the output state is indicative of a charging capability of the adaptor.

It is to be noted that, according to implementations, after the testing system is coupled with the adaptor, the adaptor can send a clock signal to the testing system through the data line of the USB interface. The clock signal is indicative of communication timing between the adaptor and the testing system. Specifically, the adaptor sends initiatively the clock signal to the testing system and sending of the clock signal can last while the adaptor is coupled with the testing system, such that the adaptor can perform two-way communication with the testing system under control of the communication timing.

In addition, according to implementations, the communication timing includes a time period for sending instructions by the adaptor and a time period for receiving instructions from the adaptor, where the time period for sending and the time period for receiving occur alternately.

In addition, according to implementations, after being coupled with the adaptor, the testing system can receive from the adaptor an inquiry of whether to enable the quick charging mode.

Furthermore, according to implementations, after receiving the inquiry of whether to enable the quick charging mode, the testing system makes a response to instruct the adaptor to enable the quick charging mode, or to instruct the adaptor not to enable the quick charging mode and to continue charging in the normal charging mode instead. Alternatively, the testing system can instruct the adaptor to disconnect from the testing system to end the two-way communication.

It is to be noted that, according to implementations, if the testing system instructs the adaptor to enable the quick charging mode, the adaptor can send the first instruction to the testing system. According to the first instruction, the output voltage can be determined.

At block 102, in response to the first instruction, the testing system acquires a first output voltage and determines a voltage state according to the first output voltage. The first output voltage as well as the second output voltage and the third output voltage mentioned hereinafter are voltages obtained in real-time and can be deemed as real-time voltages.

According to implementations, after receiving the first instruction, the testing system acquires the first output voltage in response to the first instruction, and then determines the voltage state of the adaptor according to the first output voltage.

It is to be noted that, according to implementations, after receiving the first instruction, the testing system can detect in real time the output voltage of the adaptor to obtain a real-time output voltage of the adaptor, that is, the first output voltage.

In addition, according to implementations, after acquiring the first output voltage, the testing system can compare the first output voltage with a voltage suitable for quick charging to determine the voltage state.

It is to be noted that, according to implementations, the voltage state may be that the voltage is high (first state), suitable (second state), or low (third state).

At block 103, after a charging current corresponding to quick charging is applied to the testing system, the testing system acquires a current change rate of the charging current, and determines a current state according to the current change rate.

According to implementations, after receiving the charging current corresponding to quick charging, the testing system acquires the current change rate of the charging current, thereby determining the current state of the adaptor according to the current change rate.

It is to be noted that, according to implementations, the testing system can send to the adaptor a value indicative of a maximum current suitable for quick charging. Then the adaptor can transmit the charging current to the testing system according to the maximum current value.

In addition, according to implementations, after the charging current corresponding to quick charging is applied to the testing system by the adaptor, the testing system detects in real time the charging current to determine a change in the charging current, that is, the current change rate.

It is to be noted that, based on FIG. 1, in stage 4 of the communication for quick charging, after receiving the maximum current value sent by the testing system, the adaptor outputs a real-time current change when the adaptor begins to perform quick charging on the testing system. The output current of the adaptor increases continuously, that is, the charging current applied to the testing system increases continuously, and accordingly, the testing system can detect to acquire the current change rate.

In addition, according to implementations, after acquiring the current change rate, the testing system determines the current state of the adaptor according to the current change rate. The testing system can determine a magnitude of the current change rate to determine whether a current output capability of the adaptor meets requirements.

It is to be noted that, according to implementations, the current state may meet change requirements or not meet change requirements.

At block 104, the testing system obtains a test result of the output state of the adaptor according to the voltage state and the current state.

According to implementations, after determining the voltage state and the current state, the testing system determines the test result of the output state of the adaptor according to the voltage state and the current state.

It is to be noted that, according to implementations, the output state of the adaptor includes the voltage state corresponding to the output voltage and the current state corresponding to the output current.

In addition, according to implementations, the test result of the output state includes a test result of the output voltage and a test result of the output current. In other words, the test result of the output state can be indicative of a state of the output voltage of the adaptor and a state of the output current of the adaptor.

In the method for testing an output state provided herein, after instructing the adaptor to enable quick charging, the testing system receives the first instruction, where the first instruction is used for instructing determination of the state of output voltage. In response to the first instruction, the testing system acquires the first output voltage and determines the voltage state according to the first output voltage. After the charging current corresponding to quick charging is applied to the testing system, the testing system acquires the current change rate of the charging current and determines the current state according to the current change rate. The testing system obtains the test result of the output state of the adaptor according to the voltage state and the current state. As can be seen, according to implementations, after instructing the adaptor to enable quick charging, the testing system can detect the output voltage of the adaptor to acquire the first output voltage and then determine the voltage state of the adaptor according to the first output voltage. After the charging current corresponding to quick charging is applied to the testing system, the testing system can detect the output current of the adaptor to acquire the current change rate of the charging current and then determine the current state of the adaptor. As such, the test result of the output state of the adaptor can be obtained. The testing system according to implementations can detect directly the voltage state and the current state of the adaptor while communicating with the adaptor, and therefore during detection of the output state of the adaptor, the number of detecting instructions can be decreased and a detecting process can be simplified, thereby improving greatly detecting efficiency and detecting accuracy.

Based on above implementations, in some implementations, the testing system determines the voltage state according to the first output voltage as follows.

When the first output voltage is higher than a preset threshold voltage, the testing system determines the voltage state to be high.

When the first output voltage is equal to the preset threshold voltage, the testing system determines the voltage state to be suitable.

When the first output voltage is lower than the preset threshold voltage, the testing system determines the voltage state to be low.

According to implementations, after acquiring the first output voltage, the testing system determines the voltage state according to the first output voltage and the preset threshold voltage set in advance.

It is to be noted that, according to implementations, the preset threshold voltage is indicative of a charging voltage corresponding to quick charging, that is, a voltage that the testing system sets for quick charging. For batteries of different terminals, the charging voltage suitable for quick charging may differ in different environments and different use conditions. Therefore, when the testing system simulates the terminal to communicate with the adaptor, the testing system can set in advance a voltage value suitable for quick charging, that is, the preset threshold voltage.

In addition, according to implementations, the testing system compares the first output voltage with the preset threshold voltage set in advance to determine the voltage state according to the comparison.

It is to be noted that, according to implementations, after comparing the first output voltage with the preset threshold voltage set in advance, if the first output voltage is higher than the preset threshold voltage, the testing system determines the voltage state to be high.

It is to be noted that, according to implementations, after comparing the first output voltage with the preset threshold voltage set in advance, if the first output voltage is equal to the preset threshold voltage, the testing system determines the voltage state to be suitable.

It is to be noted that, according to implementations, after comparing the first output voltage with the preset threshold voltage set in advance, if the first output voltage is lower than the preset threshold voltage, the testing system determines the voltage state to be low.

Figure 2B:
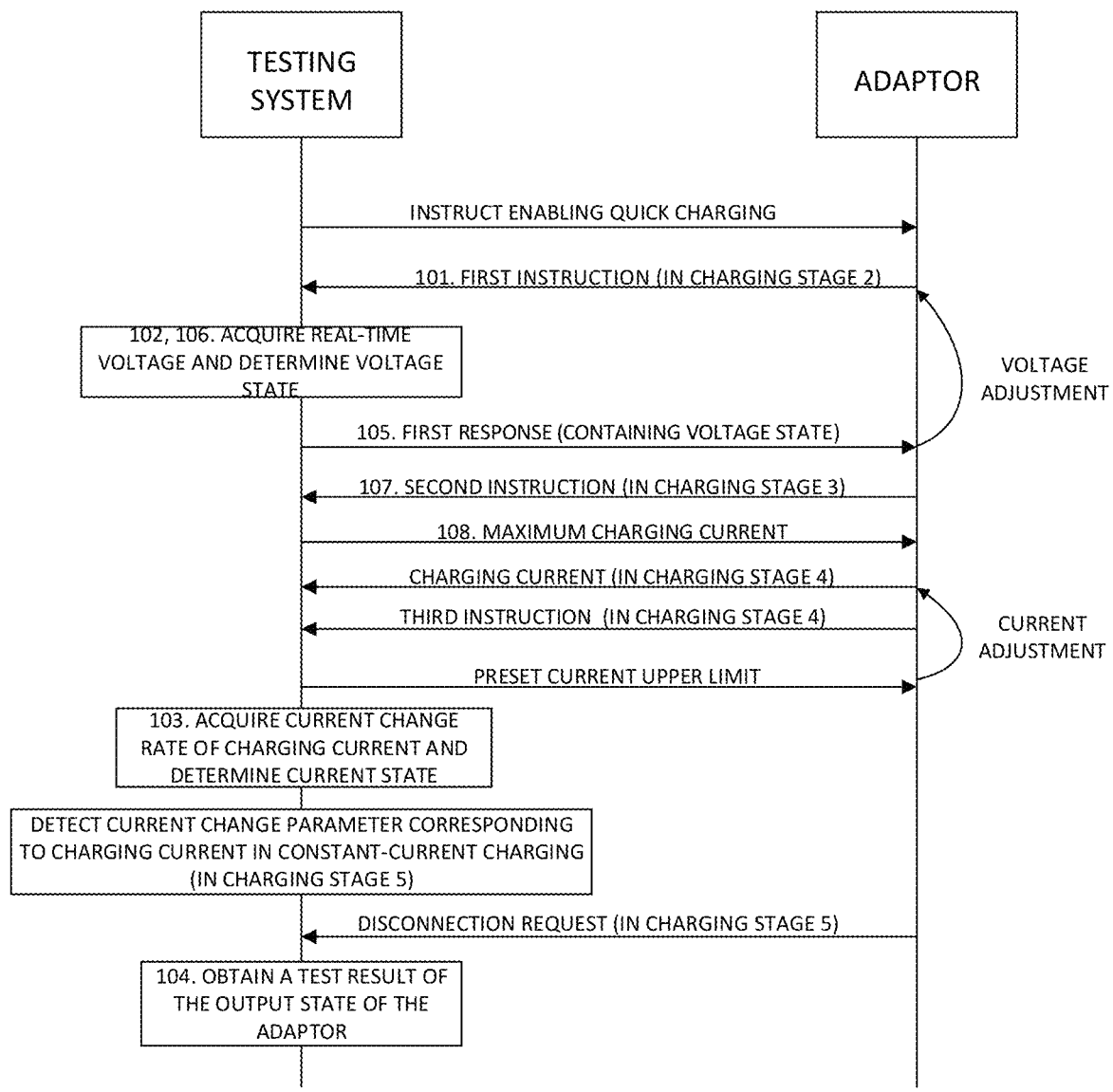
FIG. 2B is a schematic flowchart of the method for testing an output state according to implementations.

In some implementations, after acquiring the first output voltage in response to the first instruction and determining the voltage state according to the first output voltage (that is, operations at block 102), as illustrated in FIG. 2B, the testing system further performs the following operations.

At block 105, the testing system sends a first response according to the voltage state.

According to implementations, after acquiring the first output voltage in response to the first instruction and then determining the voltage state according to the first output voltage, the testing system sends the first response according to the voltage state.

It is to be noted that, according to implementations, the first response carries the voltage state. Therefore, the first response can be used for instructing the adaptor how to adjust the output voltage, such that the adaptor outputs the voltage suitable for quick charging.

In addition, according to implementations, after the adaptor receives from the testing system the first response that carries the voltage state, if the voltage state is that the voltage is suitable, it indicates that the output voltage of the adaptor is suitable for quick charging. In this regard, the adaptor does not need to adjust the output voltage.

Furthermore, according to implementations, after the adaptor receives from the testing system the first response that carries the voltage state, if the voltage state is that the voltage is high or low, it indicates that the output voltage of the adaptor is not suitable for quick charging. In this regard, the adaptor needs to adjust the output voltage.

In some implementations, when the voltage state is not suitable, after sending the first response according to the voltage state (that is, operations at block 105), as illustrated in FIG. 2B, the testing system further performs the method as follows.

At block 106, the testing system receives again the first instruction and in response to the first instruction, acquires a second output voltage.

According to implementations, if the voltage state is not suitable (that is, high or low), after sending the first response according to the voltage state, the testing system receives again the first instruction and in response to the first instruction received again, detects again the output voltage of the adaptor to acquire the second output voltage.

It is to be noted that, according to implementations, after receiving the first response that carries the voltage state, if the voltage state is high or low, the adaptor adjusts the output voltage to make the output voltage suitable for quick charging.

In addition, according to implementations, the output voltage of the adaptor can correspond to multiple grades. If the adaptor receives from the testing system feedback that the output voltage is high or low, the adaptor adjusts the output voltage by one grade and sends again the first instruction to the testing system to ask again the testing system whether the output voltage is suitable.

It is to be noted that, according to implementations, after receiving again the first instruction, the testing system can consider that the adaptor has adjusted the output voltage and therefore can detect again the output voltage of the adaptor to acquire the second output voltage, as illustrated in FIG. 2B.

Continuing, at block 106, the testing system determines again the voltage state according to the second output voltage until the voltage state becomes suitable.

According to implementations, after receiving again the first instruction and in response to the first instruction, acquiring the second output voltage, the testing system can determine again the voltage state according to the second output voltage detected until the voltage state becomes suitable.

It is to be noted that, according to implementations, after detecting again the output voltage of the adaptor to acquire the second output voltage, if the second output voltage acquired is equal to the preset threshold voltage, the testing system determines the voltage state to be suitable.

In addition, according to implementations, after detecting again the output voltage of the adaptor to acquire the second output voltage, if the second output voltage acquired is higher than or lower than the preset threshold voltage, the testing system determines the voltage state to be high or low.

It is to be noted that, according to implementations, after determining again the voltage state, the testing system sends again to the adaptor the first response according to the voltage state determined.

In addition, according to implementations, the adaptor needs to adjust continuously the output voltage according to the first response until the voltage state becomes suitable.

In the method for testing an output state provided herein, after instructing the adaptor to enable the quick charging, the testing system receives the first instruction, where the first instruction instructs the testing system to determine the state of output voltage. In response to the first instruction, the testing system acquires the first output voltage and determines the voltage state according to the first output voltage. After the charging current corresponding to the quick charging is applied to the testing system, the testing system acquires the current change rate of the charging current and determines the current state according to the current change rate. The testing system obtains the test result of the output state of the adaptor according to the voltage state and the current state. As can be seen, according to implementations, after instructing the adaptor to enable the quick charging, the testing system can detect the output voltage of the adaptor to acquire the first output voltage and then determine the voltage state of the adaptor according to the first output voltage. After the charging current corresponding to the quick charging is applied to the testing system, the testing system can also detect the output current of the adaptor to acquire the current change rate of the charging current and then determine the current state of the adaptor. Accordingly, the test result of the output state of the adaptor can be obtained. The testing system according to implementations can detect directly the voltage state and the current state of the adaptor while communicating with the adaptor, which decreases the number of detecting instructions and simplifies a detecting process during detection of the output state of the adaptor, thereby improving greatly detecting efficiency and detecting accuracy.

Based on the above implementations, in some implementations, the method further includes the following after determining again the voltage state according to the second output voltage until the voltage state becomes suitable. The testing system reads a duration in which the adaptor adjusts the first output voltage to the second output voltage. Such duration can be referred as a voltage adjustment duration.

Then the testing system generates the test result of the output state according to the voltage adjustment duration and a preset threshold duration.

It is to be noted that, when the testing system simulates the communication for quick charging between the terminal and the adaptor, in stage 2 described above, after the testing system sends the voltage state to the adaptor, if the voltage state is not suitable, the adaptor adjusts the output voltage until receiving a response indicating that the voltage state is suitable. The testing system records a process in which the adaptor adjusts the output voltage, that is, reads the voltage adjustment duration in which the adaptor adjusts the voltage state that is high or low until the voltage state becomes suitable. Then the testing system determines the test result of the output state according to the voltage adjustment duration and the preset threshold duration.

In addition, according to implementations, the test result further includes whether the adaptor meets voltage adjustment requirements. If the voltage adjustment duration is shorter than or equal to the preset threshold duration, the adaptor can be determined to meet the voltage adjustment requirements. If the voltage adjustment duration is longer than the preset threshold duration, the adaptor can be determined not to meet the voltage adjustment requirements.

In some implementations, after acquiring the second output voltage, the testing system compares the second output voltage with the first output voltage to obtain a voltage adjustment mode, where the voltage adjustment mode includes increasing voltage and decreasing voltage. Then the testing system generates the test result of the output state according to the voltage state and the voltage adjustment mode.

It is to be noted that, when the testing system simulates the terminal to perform communication for quick charging with the adaptor, in stage 2 described above, after the testing system sends the voltage state to the adaptor, the adaptor increases or decreases the output voltage if the voltage state is not suitable. If the voltage state is low, the adaptor needs to increase voltage. If the voltage state is high, the adaptor needs to decrease voltage.

In addition, according to implementations, after acquiring the second output voltage, the testing system compares the second output voltage with the first output voltage to obtain the voltage adjustment mode, that is, to determine whether the adaptor increases voltage or decreases voltage. Then the testing system generates the test result according to the voltage adjustment mode and the voltage state.

It is to be noted that, according to implementations, the test result further includes whether the voltage adjustment mode of the adaptor matches the voltage state. If the voltage state is low and the first output voltage is lower than the second output voltage, it can be determined according to the voltage state that the adaptor has increased voltage, that is, the voltage adjustment mode of the adaptor matches the voltage state.

In some implementations, when the testing system simulates the communication for quick charging between the terminal and the adaptor, in stage 4 described above, the method further includes the following after the charging current corresponding to quick charging is applied to the testing system. The testing system receives a third instruction, where the voltage state in a constant-current charging stage is determined according to the third instruction. The testing system acquires a third output voltage in response to the third instruction. The testing system detects the charging current when the third output voltage is higher than or equal to a preset voltage for the quick charging. When the charging current is larger than or equal to a preset upper-limit current, the testing system sends the preset upper-limit current to the adaptor, whereby the adaptor updates the charging current according to the preset upper-limit current.

It is to be noted that, according to implementations, after the charging current is applied to the testing system, the testing system receives from the adaptor the third instruction, where the third instruction is used for instructing determination of a voltage state in the constant-current charging stage. In response to the third instruction, the testing system detects in real time the output voltage of the adaptor to acquire the third output voltage. If the third output voltage is higher than or equal to the preset voltage for quick charging and the charging current is larger than or equal to the preset upper-limit current, the testing system sends the preset upper-limit current to the adaptor to control the adaptor to control the output current according to the preset upper-limit current.

It is to be noted that, according to implementations, the preset voltage for quick charging and the preset upper-limit current correspond to each other. For example, the testing system detects in real time the voltage to acquire the third output voltage V1. If V1 is higher than or equal to the preset voltage for quick charging V2 and the charging current I1 acquired is larger than or equal to the preset upper-limit current I2, the testing system sends the preset upper-limit current I2 to the adaptor to control the adaptor to control the output current according to I2. If V1 is higher than or equal to the preset voltage for quick charging V3 and the charging current I1 acquired is larger than or equal to the preset upper-limit current I3, the testing system sends the preset upper-limit current I3 to the adaptor to control the adaptor to control the output current according to I3.

In some implementations, after receiving the third instruction, in response to the third instruction received, the testing system detects a voltage variation parameter according to a preset time period. The testing system sends an end instruction to the adaptor when the voltage variation parameter is greater than or equal to a preset sudden-change threshold. Then the testing system receives an end response corresponding to the end instruction. For example, when the testing system detects voltage values {4.396, 3.484}, the difference between which is greater than or equal to the preset sudden-change threshold, the testing system can consider that a sudden change in voltage has occurred, and accordingly, the testing system sends the voltage values {4.396, 3.484} and the end instruction to the adaptor.

It is to be noted that, according to implementations, in quick charging, the testing system needs to detect in real time voltage variation. The testing system detects the voltage variation according to the preset time period to acquire the voltage variation parameter. If the voltage variation parameter is greater than or equal to the preset sudden-change threshold, the testing system can consider that the sudden change in voltage has occurred. In this situation, the testing system needs to notify charging and therefore sends the end instruction to the adaptor.

In some implementations, the method further includes the following after sending the end instruction to the adaptor and receiving the end response corresponding to the end instruction. The testing system acquires a duration required to end charging ("end duration" for short), where the end duration is indicative of time taken for the adaptor to respond to the end instruction. After acquiring the end duration, the testing system generates the test result of the output state according to the end duration and a preset threshold end duration.

It is to be noted that, according to implementations, the test result further includes whether the adaptor is able to respond quickly to the end instruction. If the end duration is shorter than or equal to the preset threshold end duration, the testing system can consider that the adaptor is able to respond quickly to the end instruction received. If the end duration is longer than the preset threshold end duration, the testing system can consider that the time taken for the adaptor to respond to the end instruction received does not meet requirements.

In some implementations, the method further includes the following after sending the end instruction and receiving the end response corresponding to the end instruction. If the third instruction is received again, the testing system, in response to the third instruction received, sends a reset inquiry message, where the reset inquiry message is used for inquiring a reset state of the adaptor. Then the testing system receives from the adaptor a reset response corresponding to the reset inquiry message, where the reset response is indicative of the reset state of the adaptor.

In some implementations, when the testing system simulates the terminal to communicate with the adaptor for quick charging, in stage 5 described above, the method further includes the following after the charging current corresponding to quick charging is applied to the testing system. During constant-current charging, the testing system detects a current change parameter of the charging current. Then the testing system generates the test result of the output state according to the current change parameter and a preset control accuracy.

It is to be noted that, according to implementations, the test result further includes whether the adaptor satisfies a current control accuracy. If the current change parameter is less than or equal to the preset control accuracy, the testing system can consider that the adaptor satisfies the current control accuracy. If the current change parameter is greater than the preset control accuracy, the testing system can consider that the adaptor does not satisfy the current control accuracy.

In some implementations, when the testing system simulates the communication for quick charging between the terminal and the adaptor, in stage 5 described above, the method further includes the following before obtaining the test result of the output state of the adaptor according to the voltage state and the current state. After the adaptor is disconnected from an external power supply, the testing system receives a disconnection request from the adaptor, where the disconnection request carries a time at which the adaptor is disconnected from the power-supply. Then testing system is disconnected from the adaptor in response to the disconnection request.

In some implementations, the method further includes the following after disconnecting from the adaptor in response to the disconnection request. The testing system records a time at which the testing system is disconnected from the adaptor. Then the testing system determines a disconnection time interval according to the time at which the adaptor is disconnected from the power-supply and the time at which the testing system is disconnected from the adaptor, that is, determines a time interval from when the adaptor is disconnected from the external power supply to when communication between the testing system and the adaptor is disconnected. After determining the disconnection time interval, the testing system generates the test result of the output state according to the disconnection time interval and a preset threshold interval.

It is to be noted that, according to implementations, the test result further includes whether the adaptor is able to disconnect communication quickly. If the disconnection time interval is shorter than or equal to the preset threshold interval, the testing system can consider that the adaptor is able to disconnect communication quickly. If the disconnection time interval is longer than the preset threshold interval, the testing system can consider that the adaptor is unable to disconnect communication quickly.

Based on the above implementations, in some implementations, the testing system acquires the current change rate of the charging current as follows. The testing system acquires the current change rate by detecting in real time the charging current at a preset time interval.

It is to be noted that, according to implementations, the testing system can set a time interval at which current change is detected, that is, the preset time interval. For example, the testing system sets in advance the preset time interval to be 1s (second). In this way, after the charging current is applied to the system, the testing system detects the charging current at an interval of 1s and then acquires the current change rate of the charging current.

In some implementations, the testing system determines the current state according to the current change rate as follows.

In one aspect, the testing system determines that the current state meets change requirements when the current change rate is less than or equal to a preset threshold rate.

According to implementations, after determining the current change rate of the charging current, if the current change rate is less than or equal to the preset threshold rate, the testing system determines that the current state meets the change requirements.

It is to be noted that, according to implementations, the testing system can set in advance a lower limit of the change rate, that is, the preset threshold rate. As such, the testing system can determine, according to the preset threshold rate, whether the output current of the adaptor satisfies current change conditions for quick charging.

In addition, according to implementations, after determining the current change rate, the testing system compares the current change rate with the preset threshold rate to determine, according to the comparison, whether the current state of the adaptor meets the change requirements. Specifically, when a current of the adaptor is increased gradually to the preset threshold current, the current change rate of the charging current should be less than the preset threshold rate.

It is to be noted that, according to implementations, after comparing the current change rate with the preset threshold rate, if the current change rate is less than or equal to the preset threshold rate, the testing system can consider that change in the output current of the adaptor meets requirements on quick charging, thus determining that the current state meets the change requirements.

In another aspect, the testing system determines that the current state does not meet the change requirements when the current change rate is greater than the preset threshold rate.

According to implementations, after determining the current change rate of the charging current, if the current change rate is greater than the preset threshold rate, the testing system determines that the current state does not meet the change requirements.

In addition, according to implementations, after determining the current change rate, the testing system compares the current change rate with the preset threshold rate to determine whether the current state of the adaptor meets the change requirements according to the comparison.

It is to be noted that, according to implementations, after comparing the current change rate with the preset threshold rate, if the current change rate is greater than the preset threshold rate, the testing system can consider that change in the output current of the adaptor does not meet the requirements on the quick charging, thus determining that the current state does not meet the change requirements.

In some implementations, as illustrated in FIG. 2B, the method further includes the following before acquiring the current change rate of the charging current and determining the current state according to the current change rate.

At block 107, the testing system receives a second instruction, where the second instruction is used for inquiring an upper limit of the charging current.

According to implementations, before acquiring the current change rate of the charging current and determining the current state according to the current change rate, the testing system acquires first the second instruction.

It is to be noted that, according to implementations, the second instruction is used for inquiring, by the adaptor, the upper limit of the charging current, that is, for determining the maximum charging current for quick charging.

In addition, according to implementations, based on FIG. 1, when the testing system simulates the terminal to communicate with the adaptor for quick charging, the testing system can receive the second instruction in stage 3 described above.

At block 108, in response to the second instruction, the testing system sends a preset threshold current, where the charging current is determined at the adaptor according to the preset threshold current.

According to implementations, after receiving the second instruction, the testing system sends the preset threshold current which is set in advance to the adaptor in response to the second instruction.

It is to be noted that, according to implementations, the charging current is determined at the adaptor according to the preset threshold current, and the preset threshold current is indicative of the maximum charging current for quick charging performed by the adaptor.

In addition, according to implementations, for batteries of different terminals, the charging current suitable for quick charging may differ in different environments and different use conditions. Therefore, when the testing system simulates the terminal to communicate with the adaptor, the testing system can set in advance a maximum current value suitable for quick charging, that is, the preset threshold current.

In addition, according to implementations, after the testing system sends the preset threshold current to the adaptor, the adaptor can apply the preset threshold current to the testing system for quick charging.

The order or presenting the steps is non-limiting, and the steps may generally be performed in any order unless expressly limited. For example, the test result can be generated for several times, it can be generated after the current state and the voltage state is determined, or it can be determined after current change parameter or voltage adjustment duration is determined via interaction between the testing system and the adaptor.

In the method for testing an output state provided herein, after instructing the adaptor to enable the quick charging, the testing system receives the first instruction, where the first instruction instructs the testing system to determine the state of output voltage. In response to the first instruction, the testing system acquires the first output voltage and determines the voltage state according to the first output voltage. After the charging current corresponding to the quick charging is applied to the testing system, the testing system acquires the current change rate of the charging current and determines the current state according to the current change rate. The testing system obtains the test result of the output state of the adaptor according to the voltage state and the current state. As can be seen, according to implementations, after instructing the adaptor to enable the quick charging, the testing system can detect the output voltage of the adaptor to acquire the first output voltage and then determine the voltage state of the adaptor according to the first output voltage. After the charging current corresponding to the quick charging is applied to the testing system, the testing system can also detect the output current of the adaptor to acquire the current change rate of the charging current and then determine the current state of the adaptor. Accordingly, the testing system can obtain the test result of the output state of the adaptor. While communicating with the adaptor, the testing system according to implementations can detect directly the voltage state and the current state of the adaptor, which is possible to decrease the number of detecting instructions and simplify a detecting process during detection of the output state of the adaptor, thereby improving greatly detecting efficiency and detecting accuracy.

Figure 6:
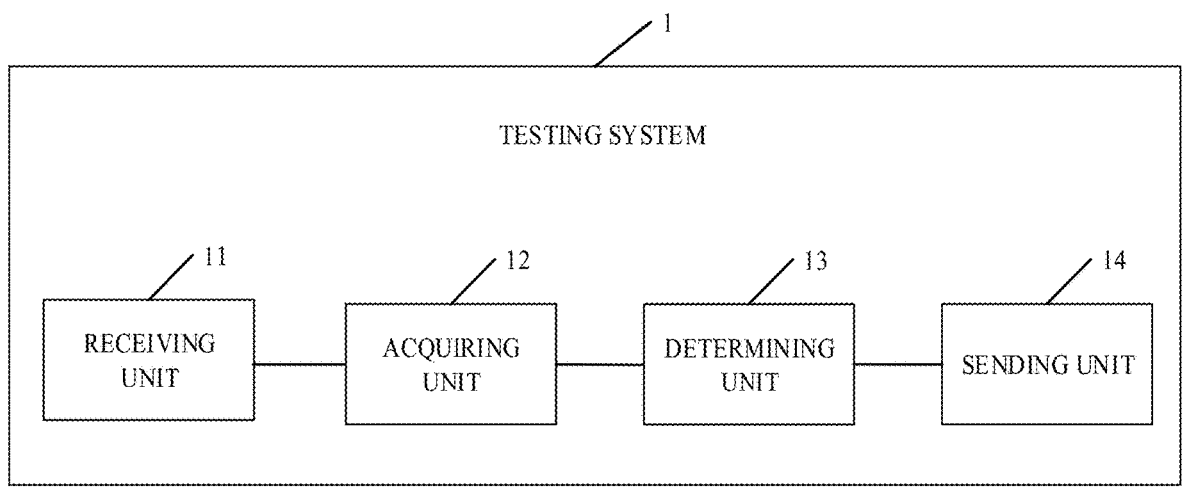
FIG. 6 is schematic structural diagram 1 of a testing system according to implementations.

Based on the foregoing implementations, FIG. 6 is schematic structural diagram 1 of a testing system according to implementations. As illustrated in FIG. 6, the testing system 1 includes a receiving section 11, an acquiring section 12, a determining section 13, and a sending section 14. The receiving section 11 can be implemented with a receiver, a transceiver, a receiving circuit, and the like. The acquiring section 12 can be implemented as a current/voltage detector or detecting circuit. The determining section 13 can be implemented as a processor or controller. The sending section 14 can be implemented as a transmitter or transmitting circuit.

Additionally or alternatively, the sections given above can be implemented as programs or program codes stored in a memory. When executed by a processor of the testing system, the program codes can cause the operating system to perform the foregoing method for testing output state of an adaptor.

In some implementations, the program codes can cause the operating system to: receive a first instruction from the adaptor after the testing system instructs the adaptor to enable quick charging, wherein the first instruction is used for instructing determination of an voltage state of the adaptor; acquire an output voltage in response to the first instruction; determine the voltage state according to the output voltage; receive a charging current corresponding to the quick charging from the adaptor; acquire a current change rate of the charging current; determine a current state according to the current change rate; and obtain a test result of the output state of the adaptor according to the voltage state and the current state.

In some implementations, the program codes can further cause the operating system to: send a first response according to the voltage state, wherein the first response carries the voltage state, wherein the adaptor adjusts the output voltage according to the voltage state; determine a duration indicative of time taken for the adaptor to adjust the output voltage by one grade; obtain the test result of the output state according to the duration and a preset threshold duration.

In some implementations, the program codes can further cause the operating system to: acquire the current change rate by detecting in real time the charging current at a preset time interval; determine the current state by comparing the current change rate with a preset threshold rate.

The testing system will be described below in detail in terms of the sections.

The receiving section 11 is configured to receive a first instruction after an adaptor is instructed to enable quick charging, where the first instruction instructs the testing system to determine a state of output voltage. The acquiring section 12 is configured to acquire a first output voltage in response to the first instruction. The determining section 13 is configured to determine a voltage state according to the first output voltage. The acquiring section 12 is further configured to acquire a current change rate of a charging current corresponding to the quick charging after the charging current is applied to the testing system. The determining section 13 is further configured to determine a current state according to the current change rate. The acquiring section 12 is further configured to obtain a test result of the output state of the adaptor according to the voltage state and the current state.

In some implementations, the determining section 13 is configured to operate as follows. The determining section 13 is configured to determine the voltage state to be high when the first output voltage is higher than a preset threshold voltage. The determining section 13 is configured to determine the voltage state to be suitable when the first output voltage is equal to the preset threshold voltage. The determining section 13 is configured to determine the voltage state to be low when the first output voltage is lower than the preset threshold voltage.

In some implementations, the sending section 14 is configured to send a first response according to the voltage state after the acquiring section 12 acquires the first output voltage in response to the first instruction and the determining section 13 determines the voltage state according to the first output voltage, where the first response carries the voltage state. The receiving section 11 is further configured to receive again the first instruction and in response to the first instruction, acquire a second output voltage after the sending section 14 sends the first response according to the voltage state, when the voltage state is not suitable. The determining section 13 is further configured to determine again the voltage state according to the second output voltage until the voltage state becomes suitable.

In some implementations, the acquiring section 12 is configured to acquire the current change rate by detecting in real time the charging current at a preset time interval. The determining section 13 is configured to operate as follows. The determining section 13 is configured to determine that the current state meets change requirements when the current change rate is less than or equal to a preset threshold rate. The determining section 13 is configured to determine that the current state does not meet the change requirements when the current change rate is greater than the preset threshold rate.

In some implementations, the receiving section 11 is further configured to receive a second instruction, where the second instruction is used for inquiring an upper limit of the charging current. The sending section 14 is further configured to send a preset threshold current in response to the second instruction, where the charging current is determined at the adaptor according to the preset threshold current.

In some implementations, the acquiring section 12 is further configured to read a voltage adjustment duration in which the adaptor adjusts the first output voltage to the second output voltage after the determining section 13 determines again the voltage state according to the second output voltage until the voltage state becomes suitable. The determining section 13 is further configured to generate the test result of the output state according to the voltage adjustment duration and a preset threshold duration. The acquiring section 12 is further configured to compare the second output voltage with the first output voltage to obtain a voltage adjustment mode after the receiving section 11 acquires the second output voltage, where the voltage adjustment mode includes increasing voltage and decreasing voltage. The determining section 13 is further configured to generate the test result of the output state according to the voltage state and the voltage adjustment mode.

Figure 7:
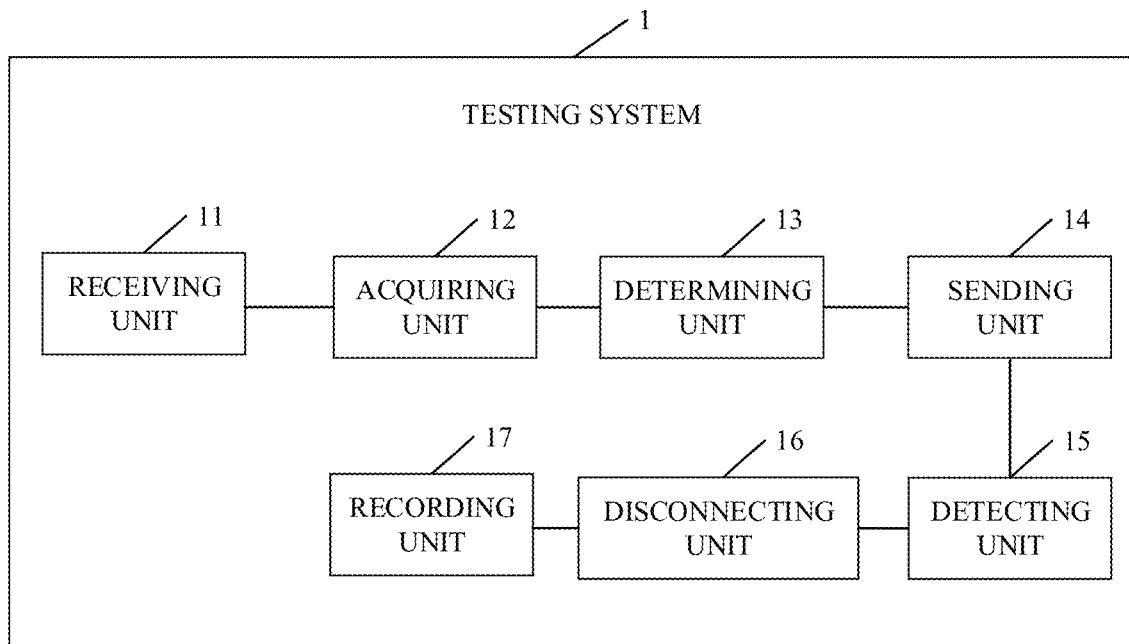
FIG. 7 is schematic structural diagram 2 of a testing system according to implementations.

FIG. 7 is schematic structural diagram 2 of a testing system according to implementations. As illustrated in FIG. 7, the testing system 1 further includes a detecting section 15, a disconnecting section 16, and a recording section 17.

The receiving section 11 is further configured to receive a third instruction after the charging current corresponding to the quick charging is received, where the voltage state in a constant-current charging stage is determined according to the third instruction. The acquiring section 12 is further configured to acquire a third output voltage in response to the third instruction. The detecting section 15 is configured to detect the charging current when the third output voltage is higher than or equal to a first preset voltage for the quick charging. The sending section 14 is further configured to send a first preset upper-limit current to the adaptor when the charging current is larger than or equal to the first preset upper-limit current, whereby the adaptor updates the charging current according to the first preset upper-limit current. The detecting section 15 is further configured to detect a voltage variation parameter according to a preset time period in response to the third instruction after the receiving section 11 receives the third instruction. The sending section 14 is further configured to send an end instruction when the voltage variation parameter is greater than or equal to a preset sudden-change threshold. The receiving section 11 is further configured to receive an end response corresponding to the end instruction. The acquiring section 12 is further configured to acquire a duration indicative of time taken for the adaptor to respond to the end instruction ("end duration" for short) after the receiving section 11 receives the end response corresponding to the end instruction. The determining section 13 is further configured to generate the test result of the output state according to the end duration and a preset threshold end duration. The sending section 14 is further configured to send a reset inquiry message in response to the third instruction received again after the receiving section 11 receives the end response corresponding to the end instruction. The receiving section 11 is further configured to receive a reset response corresponding to the reset inquiry message, where the reset response is indicative of a reset state of the adaptor.

In some implementations, the detecting section 15 is further configured to detect a current change parameter of the charging current during constant-current charging after the charging current corresponding to the quick charging is received. The determining section 13 is further configured to generate the test result of the output state according to the current change parameter and a preset control accuracy.

In some implementations, the receiving section 11 is further configured to receive a disconnection request before the acquiring section 12 obtains the test result of the output state of the adaptor according to the voltage state and the current state, where the disconnection request carries a time at which the adaptor is disconnected from a power supply. The disconnecting section 16 is configured disconnect from the adaptor in response to the disconnection request. The recording section 17 is configured to record a time at which the testing system is disconnected from the adaptor after the disconnecting section 16 disconnects from the adaptor in response to the disconnection request. The determining section 13 is further configured to operate as follows. The determining section 13 is further configured to determine a disconnection time interval according to the time at which the adaptor is disconnected from the power-supply and the time at which the testing system is disconnected from the adaptor. The determining section 13 is further configured to generate the test result of the output state according to the disconnection time interval and a preset threshold interval.

Figure 8:
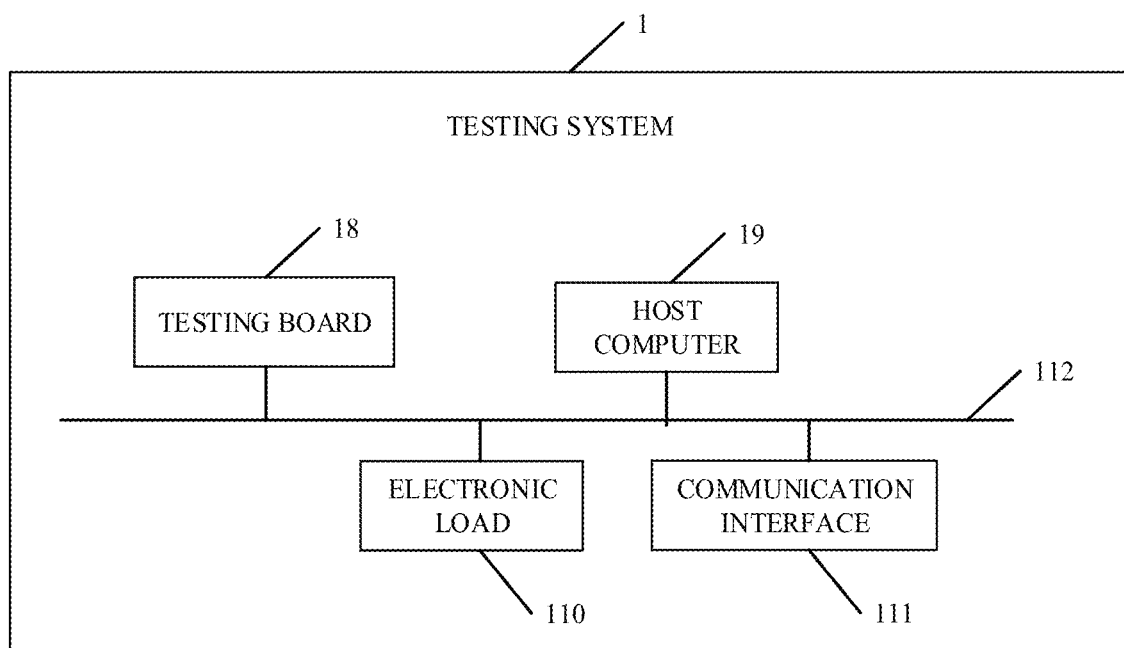
FIG. 8 is schematic structural diagram 3 of a testing system according to implementations.

FIG. 8 is schematic structural diagram 3 of a testing system according to implementations. As illustrated in FIG. 8, the testing system 1 further includes a testing board 18, a host computer 19, and an electronic load 110. The testing board is integrated with a processor and a memory configured to store instructions operable with the processor. The testing system 1 further includes a communication interface 111 and a bus 112 configured to connect the testing board 18, the host computer 19, the electronic load 110, and the communication interface 111.

In some implementations, the host computer 19 is also integrated with a processor and a memory which have functions similar to those of the processor and the memory of the testing board 18.

According to implementations, the processor may be at least one of an application specific integrated circuit (ASIC), a digital signal processor (DSP), a digital signal processing device (DSPD), a programmable logic device (PLD), a field programmable gate array (FPGA), a central processing unit (CPU), a controller, a microcontroller, and a microprocessor. It can be understood that, for different apparatuses, electronic devices for implementing a function of the processor may be other devices, which is not limited herein. The testing system 1 further includes the memory configured to be coupled with the processor. The memory is configured to store executable program codes. The executable program codes include instructions operable with a computer. The memory may include a high speed random-access memory (RAM), or may further include a non-volatile memory, for example, at least two magnetic storage devices.

According to implementations, the memory is configured to store instructions and data.

In some implementations, the processor is configured to operate as follows. The processor is configured to receive a first instruction after instructing an adaptor to enable quick charging, where the first instruction instructs the testing system to determine a state of output voltage. The processor is configured to acquire a first output voltage in response to the first instruction and determine a voltage state according to the first output voltage. The processor is configured to acquire a current change rate of a charging current corresponding to the quick charging after receiving the charging current, and determine a current state according to the current change rate. The processor is configured to obtain a test result of the output state of the adaptor according to the voltage state and the current state.

In practice, the memory may be one or more of a first volatile memory such as a first RAM, or a first non-volatile memory such as a first read-only memory (ROM), a first flash memory, a hard disk drive (HDD), or a solid-state drive (SSD) and is configured to provide instructions and data to the processor.

Various functional units described in implementations herein may be integrated into one processing unit or may be present as a number of physically separated units, and two or more units may be integrated into one. The integrated unit may take the form of hardware or a software functional unit.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. The computer software products can be stored in a storage medium and may include multiple instructions that, when executed, can cause a computing device, e.g., a personal computer, a server, a network device, etc., or a processor to execute some or all operations of the methods described in various implementations. The above storage medium may include various kinds of media that can store program codes, such as a universal serial bus (USB) flash disk, a mobile hard drive, a ROM, a RAM, a magnetic disk, or an optical disk.

In the testing system provided herein, after instructing the adaptor to enable the quick charging, the testing system receives the first instruction, where the first instruction instructs the testing system to determine the state of output voltage. In response to the first instruction, the testing system acquires the first output voltage and determines the voltage state according to the first output voltage. After the charging current corresponding to the quick charging is applied to the testing system, the testing system acquires the current change rate of the charging current and determines the current state according to the current change rate. The testing system obtains the test result of the output state of the adaptor according to the voltage state and the current state. As can be seen, according to implementations, after instructing the adaptor to enable the quick charging, the testing system can detect the output voltage of the adaptor to acquire the first output voltage and then determine the voltage state of the adaptor according to the first output voltage. After the charging current corresponding to the quick charging is applied to the testing system, the testing system can also detect the output current of the adaptor to acquire the current change rate of the charging current and then determine the current state of the adaptor, thereby obtaining the test result of the output state of the adaptor. While communicating with the adaptor, the testing system according to implementations can detect directly the voltage state and the current state of the adaptor, which can decrease the number of detecting instructions and simplify a detecting process during detection of the output state of the adaptor, thereby improving greatly detecting efficiency and detecting accuracy.

According to implementations, a computer readable storage medium is provided. The computer readable storage medium is configured to store programs which, when executed by a processor, are operable with the processor to perform the method for testing an output state described above.

The program instructions for performing the method for testing an output state may be stored in a storage medium such as the optical disk, a hard disk, the USB flash disk, etc. The program instructions for performing the method stored in the storage medium, when read or executed by an electronic device, are operable with the electronic device to: receive a first instruction after instructing an adaptor to enable quick charging, where the first instruction is used for instructing determination of a state of output voltage; in response to the first instruction, acquire a first output voltage and determine a voltage state according to the first output voltage; acquire a current change rate of a charging current corresponding to the quick charging after receiving the charging current, and determine a current state according to the current change rate; obtain a test result of the output state of the adaptor according to the voltage state and the current state.

Those skilled in the art will understand that implementations herein can provide a method, a system, or a computer program product. Therefore, the disclosure may have hardware-only implementations, software-only implementations, or software plus hardware implementations. In addition, the disclosure may be implemented in the form of a computer program product embodied on one or more computer usable storage media (including but not limited to a magnetic storage device, an optical memory, and the like) including computer usable program codes.

The disclosure is described herein with reference to schematic flowcharts and/or block diagrams of methods, apparatuses (systems), and computer program products according to the implementations of the disclosure. It should be understood that each flow and/or block in the flowchart and/or block diagram, and a combination of flow and/or block in the flowchart and/or block diagram can be implemented by computer program instructions. These computer program instructions may be provided to a general purpose computer, a special purpose computer, an embedded processor or a processor of other programmable data processing apparatuses to form a machine, such that devices for implementing functions specified by one or more flows in the flowchart and/or one or more blocks in the block diagram may be generated by executing the instructions with the processor of the computer or other programmable data processing apparatuses.

The computer program instructions may also be stored in a computer-readable memory that can direct the computer or other programmable data processing apparatuses to operate in a given manner, so that the instructions stored in the computer-readable memory produce a manufactured article including an instruction device, and the instruction device implements the functions specified by one or more flows in the flowchart and/or one or more blocks in the block diagram.

The computer program instructions may also be loaded onto the computer or other programmable data processing apparatuses, such that a series of process steps may be executed on the computer or other programmable apparatuses to produce processing implemented by the computer, so that the instructions executed on the computer or other programmable apparatuses provide steps for implementing the functions specified by one or more flows in the flowchart and/or one or more blocks in the block diagram.

The above implementations are only the exemplary implementations of the disclosure and are however not for limiting the scope of the disclosure.

INDUSTRIAL APPLICABILITY

Provided are a method for testing an output state, a system for testing an output state, and a computer storage medium. After instructing an adaptor to enable quick charging, a testing system receives a first instruction, where the first instruction is used for instructing determination of a state of output voltage. In response to the first instruction, the testing system acquires a first output voltage and determines a voltage state according to the first output voltage. After a charging current corresponding to the quick charging is applied to the testing system, the testing system acquires a current change rate of the charging current and determines a current state according to the current change rate. The testing system obtains a test result of the output state of the adaptor according to the voltage state and the current state. As can be seen, according to implementations, after instructing the adaptor to enable the quick charging, the testing system can detect the output voltage of the adaptor to acquire the first output voltage and then determine the voltage state of the adaptor according to the first output voltage. After the charging current corresponding to the quick charging is applied to the testing system, the testing system can detect the output current of the adaptor to acquire the current change rate of the charging current and then determine the current state of the adaptor, thereby obtaining the test result of the output state of the adaptor. The testing system according to implementations can detect directly the voltage state and the current state of the adaptor while communicating with the adaptor, and therefore during detection of the output state of the adaptor, the number of detecting instructions can be decreased and a detecting process can be simplified, which improves greatly detecting efficiency and detecting accuracy.

What is claimed is:

1. A method for testing an output state of an adaptor, performed by a testing system connected with the adaptor and comprising:
   receiving a first instruction from the adaptor after instructing the adaptor to enable quick charging, wherein the first instruction is used for instructing determination of a voltage state of the adaptor;
   in response to the first instruction, acquiring a first output voltage of the adaptor, and determining the voltage state of the adaptor according to the first output voltage;
   acquiring a current change rate of a charging current corresponding to the quick charging after the charging current is applied, and determining a current state of the adaptor according to the current change rate; and
   obtaining a test result of the output state of the adaptor according to the voltage state and the current state;
   after receiving the charging current corresponding to the quick charging, receiving a third instruction, wherein the third instruction is used for instructing determination of the voltage state of the adaptor in a constant-current charging stage;
   in response to the third instruction, acquiring a third output voltage;
   detecting the charging current in response to the third output voltage being higher than or equal to a preset voltage for the quick charging; and
   sending a preset upper-limit current to the adaptor in response to the charging current being larger than or equal to the preset upper-limit current, the preset upper-limit current being used by the adaptor to update the charging current.

2. The method of claim 1, wherein determining the voltage state according to the first output voltage comprises:
   determining the voltage state to be a first state in response to the first output voltage being higher than a preset threshold voltage;
   determining the voltage state to be a second state in response to the first output voltage being equal to the preset threshold voltage; and
   determining the voltage state to be a third state in response to the first output voltage being lower than the preset threshold voltage.

3. The method of claim 1, wherein acquiring the current change rate of the charging current comprises:
   acquiring the current change rate by detecting in real time the charging current at a preset time interval.

4. The method of claim 1, further comprising:
   before acquiring the current change rate of the charging current and determining the current state according to the current change rate,
   receiving a second instruction from the adaptor, wherein the second instruction is used for inquiring an upper limit of the charging current; and
   in response to the second instruction, sending a preset threshold current to the adaptor, wherein the preset threshold current is used by the adaptor to determine the charging current.

5. The method of claim 1, further comprising:
   after receiving the third instruction,
   in response to the third instruction, detecting a voltage variation parameter according to a preset time period;
   sending an end instruction in response to the voltage variation parameter being greater than or equal to a preset sudden-change threshold; and
   receiving an end response corresponding to the end instruction.

6. The method of claim 1, further comprising:
   after receiving the charging current corresponding to the quick charging,
   detecting a current change parameter of the charging current during constant-current charging; and
   obtaining the test result of the output state according to the current change parameter and a preset control accuracy.

7. The method of claim 1, further comprising:
   before obtaining the test result of the output state of the adaptor according to the voltage state and the current state,
   receiving a disconnection request; and
   in response to the disconnection request, disconnecting from the adaptor.

8. The method of claim 2, further comprising:
   after acquiring the first output voltage in response to the first instruction and determining the voltage state according to the first output voltage, sending a first response according to the voltage state, wherein the first response carries the voltage state.

9. The method of claim 3, wherein determining the current state according to the current change rate comprises:
   determining that the current state meets change requirements in response to the current change rate being less than or equal to a preset threshold rate; and
   determining that the current state does not meet the change requirements in response to the current change rate being greater than the preset threshold rate.

10. The method of claim 5, further comprising:
    after receiving the end response corresponding to the end instruction,
    acquiring a duration indicative of time taken for the adaptor to respond to the end instruction; and
    obtaining the test result of the output state according to the duration and a preset threshold duration.

11. The method of claim 5, further comprising:
    after receiving the end response corresponding to the end instruction:
    in response to the third instruction received again, sending a reset inquiry message; and
    receiving a reset response corresponding to the reset inquiry message, wherein the reset response is indicative of a reset state of the adaptor.

12. The method of claim 7, wherein the disconnection request carries a time at which the adaptor is disconnected from a power supply, and the method further comprises:
after disconnecting from the adaptor in response to the disconnection request,
recording a time at which the testing system is disconnected from the adaptor;
determining a disconnection time interval according to the time at which the adaptor is disconnected from the power-supply and the time at which the testing system is disconnected from the adaptor; and
obtaining the test result of the output state according to the disconnection time interval and a preset threshold interval.

13. The method of claim 8, wherein when the voltage state is the first state or the third state, the method further comprises:
after sending the first response according to the voltage state,
receiving again the first instruction, and in response to the first instruction, acquiring a second output voltage; and
determining the voltage state according to the second output voltage until the voltage state becomes the second state.

14. The method of claim 13, further comprising:
after determining the voltage state according to the second output voltage until the voltage state becomes the second state,
determining a duration indicative of time taken for the adaptor to adjust the first output voltage to the second output voltage; and
obtaining the test result of the output state according to the duration and a preset threshold duration.

15. The method of claim 13, further comprising:
after acquiring the second output voltage,
obtaining a voltage adjustment mode by comparing the second output voltage with the first output voltage, wherein the voltage adjustment mode comprises increasing voltage and decreasing voltage; and
obtaining the test result of the output state according to the voltage state and the voltage adjustment mode.

16. A system for testing an output state of an adaptor, comprising:
at least one processor; and
a memory configured to store program codes which, when executed by the processor, are operable with the testing system to:
receive a first instruction from the adaptor after the testing system instructs the adaptor to enable quick charging, wherein the first instruction is used for instructing determination of a voltage state of the adaptor;
acquire an output voltage of the adaptor in response to the first instruction;
determine the voltage state of the adaptor according to the output voltage;
receive a charging current corresponding to the quick charging from the adaptor;
acquire a current change rate of the charging current;
determine a current state of the adaptor according to the current change rate; and
obtain a test result of the output state of the adaptor according to the voltage state and the current state;
wherein after the charging current corresponding to the quick charging is received, a third instruction is received, wherein the third instruction is used for instructing determination of the voltage state of the adaptor in a constant-current charging stage;
wherein in response to the third instruction, a third output voltage is acquired;
wherein the charging current is detected in response to the third output voltage being higher than or equal to a preset voltage for the quick charging; and
wherein a preset upper-limit current is sent to the adaptor in response to the charging current being larger than or equal to the preset upper-limit current, the preset upper-limit current being used by the adaptor to update the charging current.

17. The system of claim 16, wherein the memory is configured to store program codes which, when executed by the processor, are operable with the testing system to:
send a first response according to the voltage state, wherein the first response carries the voltage state, wherein the adaptor adjusts the output voltage according to the voltage state;
determine a duration indicative of time taken for the adaptor to adjust the output voltage by one grade; and
obtain the test result of the output state according to the duration and a preset threshold duration.

18. The system of claim 16, wherein the memory is configured to store program codes which, when executed by the processor, are operable with the testing system to:
acquire the current change rate by detecting in real time the charging current at a preset time interval; and
determine the current state by comparing the current change rate with a preset threshold rate.

19. A non-transitory computer readable storage medium configured to store programs which, when executed by a testing system for testing an output state of an adaptor, are operable with the testing system to:
receive a first instruction from the adaptor after the testing system initiates quick charging communication with the adaptor, wherein the first instruction is used for instructing determination of a voltage state of the adaptor;
acquire an output voltage of the adaptor in response to the first instruction;
determine the voltage state of the adaptor according to the output voltage;
receive a charging current corresponding to the quick charging from the adaptor;
acquire a current change rate of the charging current;
determine a current state of the adaptor according to the current change rate; and
obtain a test result of the output state of the adaptor according to the voltage state and the current state;
wherein after the charging current corresponding to the quick charging is received, a third instruction is received, wherein the third instruction is used for instructing determination of the voltage state of the adaptor in a constant-current charging stage;
wherein in response to the third instruction, a third output voltage is acquired;
wherein the charging current is detected in response to the third output voltage being higher than or equal to a preset voltage for the quick charging; and
wherein a preset upper-limit current is sent to the adaptor in response to the charging current being larger than or equal to the preset upper-limit current, the preset upper-limit current being used by the adaptor to update the charging current.

* * * * *